United States Patent
Morgan et al.

(10) Patent No.: US 11,099,618 B1
(45) Date of Patent: Aug. 24, 2021

(54) COMPACT PORTABLE DATA STORAGE DEVICE

(71) Applicant: Seagate Technology LLC, Cupertino, CA (US)

(72) Inventors: Michael Morgan, Los Altos Hills, CA (US); Ming-Hsueh Tsai, Taipei (TW)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/773,608

(22) Filed: Jan. 27, 2020

(51) Int. Cl.
| | |
|---|---|
| *G06F 1/20* | (2006.01) |
| *G06F 1/16* | (2006.01) |
| *H05K 7/20* | (2006.01) |
| *G11B 33/02* | (2006.01) |

(52) U.S. Cl.
CPC ............ *G06F 1/203* (2013.01); *G06F 1/1656* (2013.01); *G11B 33/025* (2013.01); *H05K 7/2039* (2013.01)

(58) Field of Classification Search
CPC ........ G06F 1/1658; G06F 1/1698; G06F 1/20; G06F 1/203; G06F 1/1656; H05K 5/0026; H05K 5/04; H05K 7/1427; H05K 7/2039; G11B 33/025
See application file for complete search history.

(56) References Cited

U.S. PATENT DOCUMENTS

| | | | | |
|---|---|---|---|---|
| 5,836,774 | A * | 11/1998 | Tan .................... | H01R 13/6275 439/76.1 |
| 7,457,111 | B2 * | 11/2008 | Merz ................. | G02F 1/133308 361/679.33 |
| 7,486,517 | B2 * | 2/2009 | Aapro ................... | H04M 1/026 165/104.33 |
| 8,204,561 | B2 * | 6/2012 | Mongan ................ | G06F 1/1633 455/575.8 |
| 8,342,325 | B2 | 1/2013 | Rayner | |
| 8,383,216 | B1 * | 2/2013 | Hynecek .............. | B29D 22/003 428/35.7 |

(Continued)

OTHER PUBLICATIONS

Specification, claim and figures for Design U.S. Appl. No. 29/718,039, filed Dec. 20, 2019, 10 pages total.

(Continued)

*Primary Examiner* — Stephen S Sul
*Assistant Examiner* — Michael A Matey
(74) *Attorney, Agent, or Firm* — Westman, Champlin & Koehler, P.A.

(57) ABSTRACT

A portable data storage device includes at least one component that generates heat, an enclosure wall made of a first material and having a thermal conductivity and an exterior layer. The enclosure wall surrounds the at least one computer component and includes outer and inner boundaries. The exterior layer is made of a second material and has a thermal conductivity that is less than the thermal conductivity of the first material. The exterior layer is covers the outer boundary of the enclosure wall and includes an outer surface and an inner boundary. The outer boundary of the enclosure wall interfaces with the inner boundary of the exterior layer so that the outer surface of the exterior layer is in direct contact with the environment and the outer boundary of the enclosure wall is not. Heat is transferred to the environment at the outer surface of the exterior layer.

16 Claims, 11 Drawing Sheets

(56) References Cited

U.S. PATENT DOCUMENTS

| | | | | |
|---|---|---|---|---|
| 8,439,191 B1* | 5/2013 | Lu | | H04B 1/3888 |
| | | | | 206/320 |
| 8,711,561 B2 | 4/2014 | Matsumoto et al. | | |
| 8,879,263 B2 | 11/2014 | Gunderson | | |
| 9,001,505 B2 | 4/2015 | Moore et al. | | |
| 9,078,357 B2 | 7/2015 | Gunderson | | |
| 9,123,686 B2 | 9/2015 | Mataya et al. | | |
| 9,565,910 B2 | 2/2017 | Magness | | |
| 9,999,142 B1* | 6/2018 | Chang | | H05K 5/0004 |
| 10,085,364 B2 | 9/2018 | Voss | | |
| 10,101,779 B2 | 10/2018 | Yang | | |
| 2003/0066672 A1* | 4/2003 | Watchko | | H05K 9/0045 |
| | | | | 174/50 |
| 2003/0174464 A1* | 9/2003 | Funawatari | | G11B 33/08 |
| | | | | 361/679.36 |
| 2006/0274493 A1* | 12/2006 | Richardson | | H05K 5/068 |
| | | | | 361/679.4 |
| 2007/0210082 A1* | 9/2007 | English | | H05K 9/0032 |
| | | | | 220/4.21 |
| 2009/0057190 A1* | 3/2009 | Schmeisser | | G06F 1/1632 |
| | | | | 206/592 |
| 2013/0146491 A1* | 6/2013 | Ghali | | B65B 5/04 |
| | | | | 206/320 |
| 2013/0193006 A1* | 8/2013 | Bergreen | | A45C 11/00 |
| | | | | 206/37 |
| 2013/0258586 A1* | 10/2013 | Shao | | A45C 11/00 |
| | | | | 361/679.55 |
| 2014/0152890 A1* | 6/2014 | Rayner | | H04N 5/2252 |
| | | | | 348/376 |
| 2014/0190841 A1* | 7/2014 | Nash | | A45C 11/00 |
| | | | | 206/37 |
| 2015/0077958 A1* | 3/2015 | Takayuki | | G06F 1/1658 |
| | | | | 361/759 |
| 2015/0194995 A1* | 7/2015 | Fathollahi | | A45C 11/00 |
| | | | | 455/575.8 |
| 2015/0194997 A1* | 7/2015 | Johnson | | A45C 11/00 |
| | | | | 455/575.8 |
| 2016/0006474 A1* | 1/2016 | Zhang | | H04B 1/3888 |
| | | | | 455/575.8 |
| 2016/0262270 A1* | 9/2016 | Isaacs | | H01L 23/3675 |
| 2017/0054466 A1* | 2/2017 | Flores | | H04M 1/04 |
| 2017/0164512 A1* | 6/2017 | Coulter | | F24V 30/00 |
| 2018/0103557 A1* | 4/2018 | Wright | | G06F 1/1656 |
| 2019/0113953 A1* | 4/2019 | Sutherland | | H01R 43/24 |
| 2019/0215972 A1* | 7/2019 | Jang | | G06F 1/181 |
| 2020/0196985 A1* | 6/2020 | Mallory | | A61B 8/4444 |
| 2020/0290535 A1* | 9/2020 | Wang | | H02J 7/00 |

OTHER PUBLICATIONS

Specification, claim and figures for Design U.S. Appl. No. 29/718,035, filed Dec. 20, 2019, 23 pages total.

* cited by examiner

COMPACT PORTABLE DATA STORAGE DEVICE

SUMMARY

A portable data storage device includes at least one computer component that generates heat energy, an enclosure wall made of a first material and having a thermal conductivity and an exterior layer. The enclosure wall is configured to surround the at least one computer component and includes an outer boundary and an inner boundary. The exterior layer is made of a second material and has a thermal conductivity that is less than a thermal conductivity of the first material of the enclosure wall. The exterior layer is configured to cover the outer boundary of the enclosure wall and includes an outer surface and an inner boundary. The outer boundary of the enclosure wall interfaces with the inner boundary of the exterior layer so that the outer surface of the exterior layer is in direct contact with an ambient environment and the outer boundary of the enclosure wall is not in contact with the ambient environment. The heat energy of the at least one computer component is transferred to the ambient environment at the outer surface of the exterior layer.

A portable data storage device has at least one internal heat source, a top case and a bottom case. The top case includes an interior layer and a coating layer. The interior layer is made of a first material and includes an outer boundary, an inner boundary and a rim that connects the outer boundary to the inner boundary. The coating layer is made of a second material that is configured to cover the outer boundary of the interior layer of the top case. The bottom case includes an interior layer and a coating layer. The interior layer is made of the first material and includes an outer boundary, an inner boundary and a rim that connects the outer boundary of the bottom case to the inner boundary of the bottom case. The coating layer is made of the second material that is configured to cover the outer boundary of the interior layer of the bottom case. The second material has a thermal conductivity that is less than a thermal conductivity of the first material and the heat energy from the internal heat sources is transferred to an ambient environment at outer surfaces of the coating layers of the bottom case and the top case.

A method of assembling a portable storage device includes providing a top case and a bottom case. The top case includes an interior layer made of a first material and including an outer boundary, an inner boundary and a rim that connects the outer boundary to the inner boundary and a coating layer made of a second material. The coating layer covers the outer boundary of the interior layer of the top case. The bottom case includes an interior layer made of the first material and including an outer boundary, an inner boundary and a rim that connects the outer boundary of the bottom case to the inner boundary of the bottom case and a coating layer made of the second material that covers the outer boundary of the interior layer of the bottom case. The top case is snap-fit to the bottom case and the top case is sealed to the bottom case with the coating layer of the top case.

This summary is not intended to describe each disclosed embodiment or every implementation as described herein. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

The demand for smaller, portable data storage devices with all-terrain reliability continues including the need for vent-less designs that demonstrate high data transfer performance levels. Portable data storage devices may be used to backup data from another computer or used on-the-go for creating digital data away from the home or office, such as for use by photographers and filmmakers that need durability.

The increase in performance levels causes an increase in internally generated heat. The primary way of managing heat load in vent-less designs is to transfer the heat into the environment using natural convection and radiation mechanisms. These mechanisms rely upon the outer surface area of the data storage product and temperature. However, with data storage product surface areas decreasing to make them more compact, the temperature of the product surface area is raised to higher levels to accommodate the thermal transfer of the increased heat load. The product surface temperature cannot be increased without consequences. Portable data storage devices are carried by the user, typically with the user's hands, so the surface touch temperature must be limited to avoid user damage or discomfort.

Key parameters to consider with touch temperature limits include contact time (how long the user typically holds the portable product) and surface material. To minimize the amount of heat energy that transfers from the product to the user's hand (heat sink energy), the surface material is important. If the surface material has high thermal conductivity, such as metal, a high amount of heat sink energy can be transferred at a relative low temperature level. If the surface material has poor thermal conductivity, such as a plastic or rubber, the surface temperature may reach a higher value before achieving an equivalent level of heat sink energy transfer.

Heat spreaders, typically comprised of metal materials, such as aluminum or copper, are used to effectively transfer and consistently disperse the heat energy throughout the portable product's exterior surface. The heat spreaders optimize the amount of heat energy that is transferred to the environment via natural convection and radiation. Unfortunately, these highly conductive surfaces will easily sink high amounts of thermal energy into a user's hand when held, violating the touch temperature limits. If the heat spreader material is changed to a material with poor thermal conductivity, such as plastic or rubber, the touch temperature may comply and the product may become more durable in terms of shock absorption, but the heat energy may not be consistently dispersed throughout the product's exterior surface, which results in a less efficient transfer of heat energy into the ambient environment.

Figure 1:
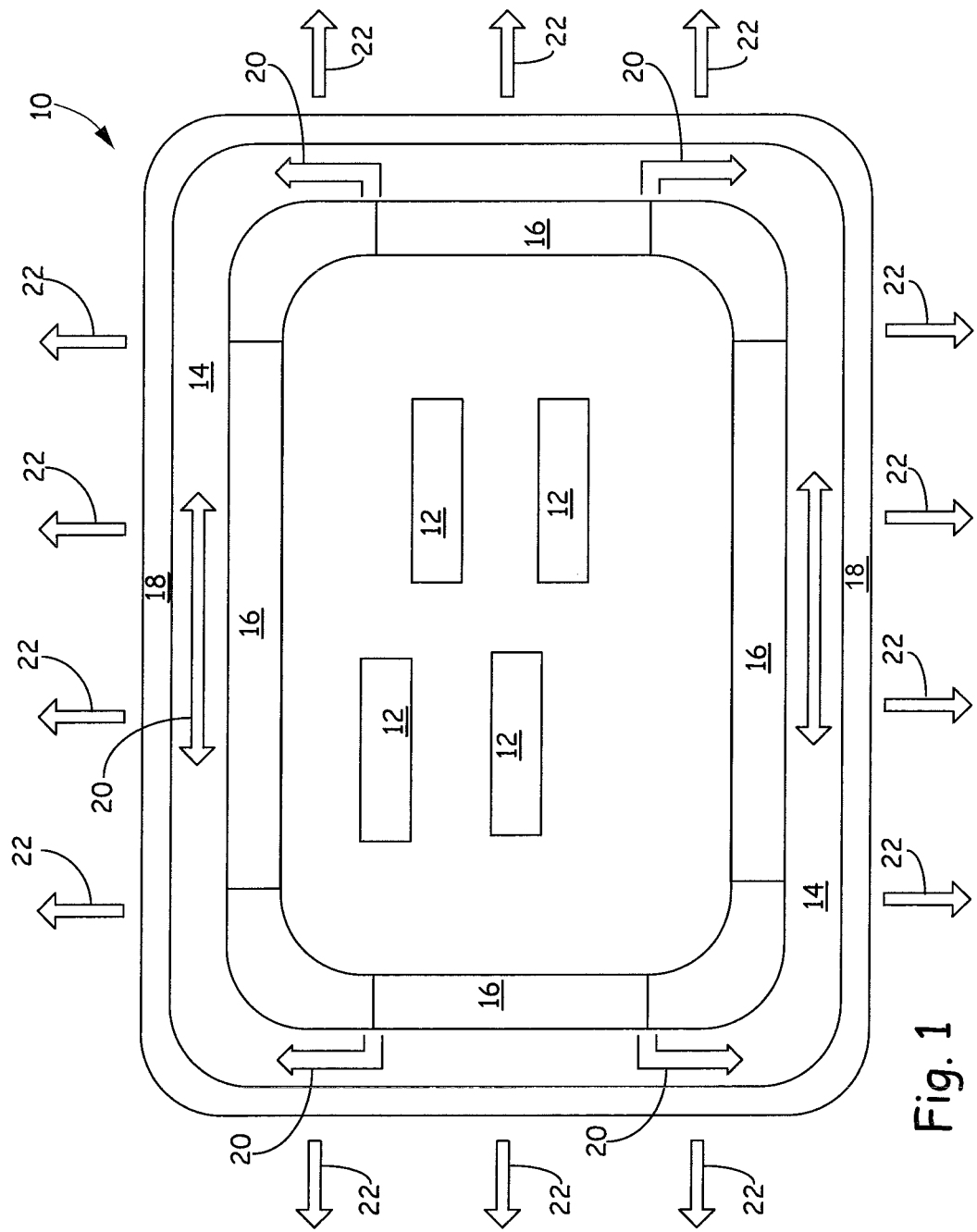
FIG. 1 is a simplified block diagram of a portable data storage device according to embodiments of the disclosure.

FIG. 1 is a simplified block diagram of a portable data storage device 10 according to embodiments of the disclosure. Portable data storage device 10 includes one or more internal computer components or heat sources 12, an enclosure wall 14, at least one thermal interface material (TIM) 16 located between the at least one internal heat source and enclosure wall 14 and an exterior layer 18. Exemplary computer components or internal heat sources 12 include integrated circuits (ICs), printed circuit boards (PCBs) and the like. TIM materials 16 may include highly conductive thermal pads and are configured to efficiently couple heat energy from internal heat sources 12 into enclosure wall 14. Enclosure wall 14, which acts as a heat spreader, is configured to surround the one or more computer components or internal heat sources 12 and is made of a first material, such as metal, for example aluminum (Al) or aluminum alloy. Enclosure wall 14 includes an outer boundary 13, an inner boundary 15 and a thickness 11. The first material of enclosure wall 14 provides a high thermal conductivity (k) to spread and disperse heat energy 20. For example, the thermal conductivity (k) of Aluminum may range from 220 to 240 W/m·K, while certain Aluminum alloys may range from 70 to 190 W/m·K. Copper may range from 340 to 415 W/m·K and copper alloys may range from 22 to 120 W/m·K. The higher the value of k, the higher the thermal conductivity of the material. Both TIM 16 and enclosure wall 14 maintain a consistent temperature distribution to optimize the efficiency of transferring heat energy 20 from internal heat sources 12.

Exterior layer 18 is configured to be applied to or to cover outer boundary 13 of enclosure wall 14 and includes an outer surface 17 that is exposed to an ambient environment, an inner boundary 19 that is in contact with outer boundary 13 of enclosure wall 14 and a thickness 21. In particular, outer boundary 13 of enclosure wall 14 interfaces with inner boundary 19 of exterior layer 18 so that outer surface 17 of exterior layer 18 is in direct contact with an ambient environment and outer boundary 13 of enclosure wall 14 is not in contact with the ambient environment. Exterior layer 18 is made of a second material, such as plastic or rubber, for example liquid silicone rubber (LSR). The second material of exterior layer 18 provides a low thermal conductivity (k). For example, the thermal conductivity (k) of LSR may range between 0.2 and 0.4 W/m·K. While the second material of exterior layer 18 overall provides a slight reduction in the thermal transfer efficiency of enclosure wall 14, exterior layer 18 reduces the amount of thermal sink energy that transfers to a user's hand when holding portable data storage device 10 without having to increase the surface area of enclosure wall 14. The reduction of thermal transfer efficiency manifests as an increase in the internal computer component temperatures. Therefore, exterior layer 18 should be made as thin as possible. Under one embodiment, thickness 21 of exterior layer 18 is less than thickness 11 of enclosure wall 14. With exterior layer 18 being made as thin as possible, the size of portable data storage device 10 is reduced. The construction of portable data storage device 10 then achieves the necessary thermal transfer to the ambient environment at outer surface 17 of exterior layer 18 through natural convection and radiation 22, while maintaining a negligible increase in internal component temperatures.

Figure 2:
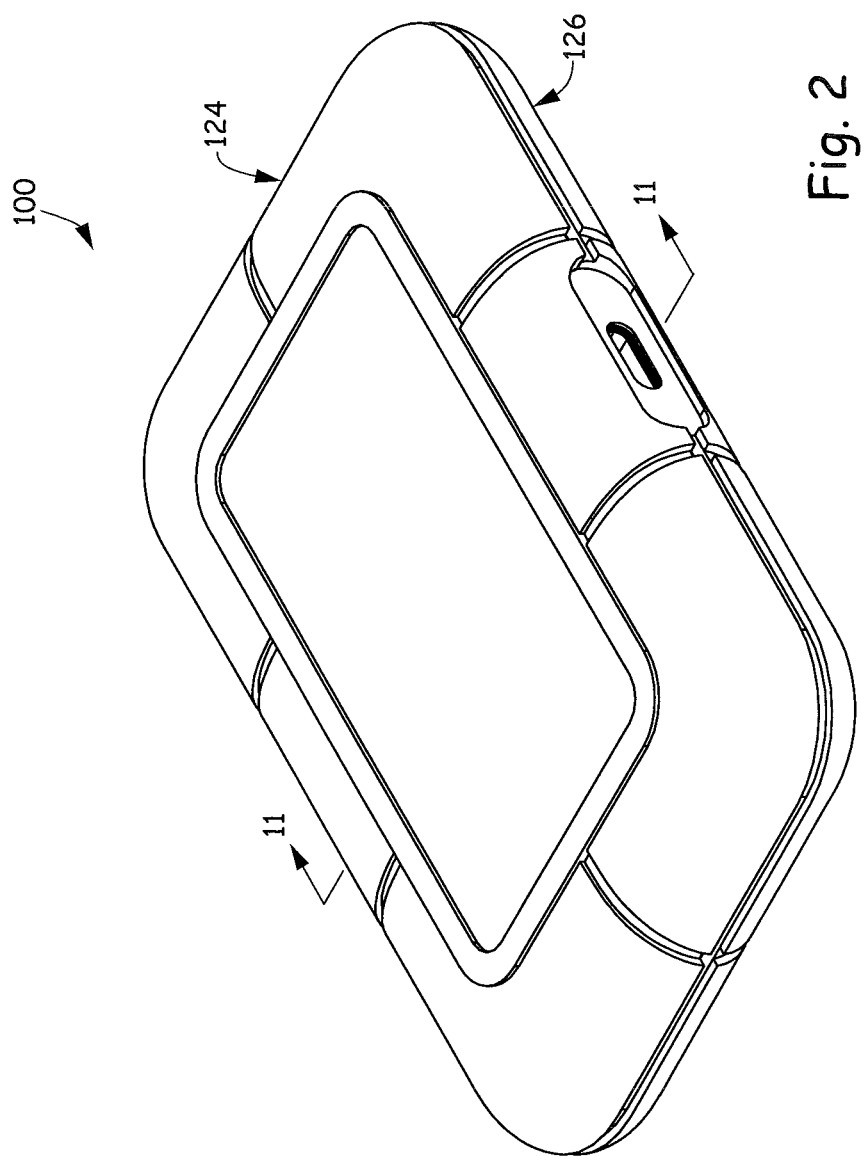
FIG. 2 illustrates a perspective view of a portable data storage device according to an embodiment.
Figure 3:
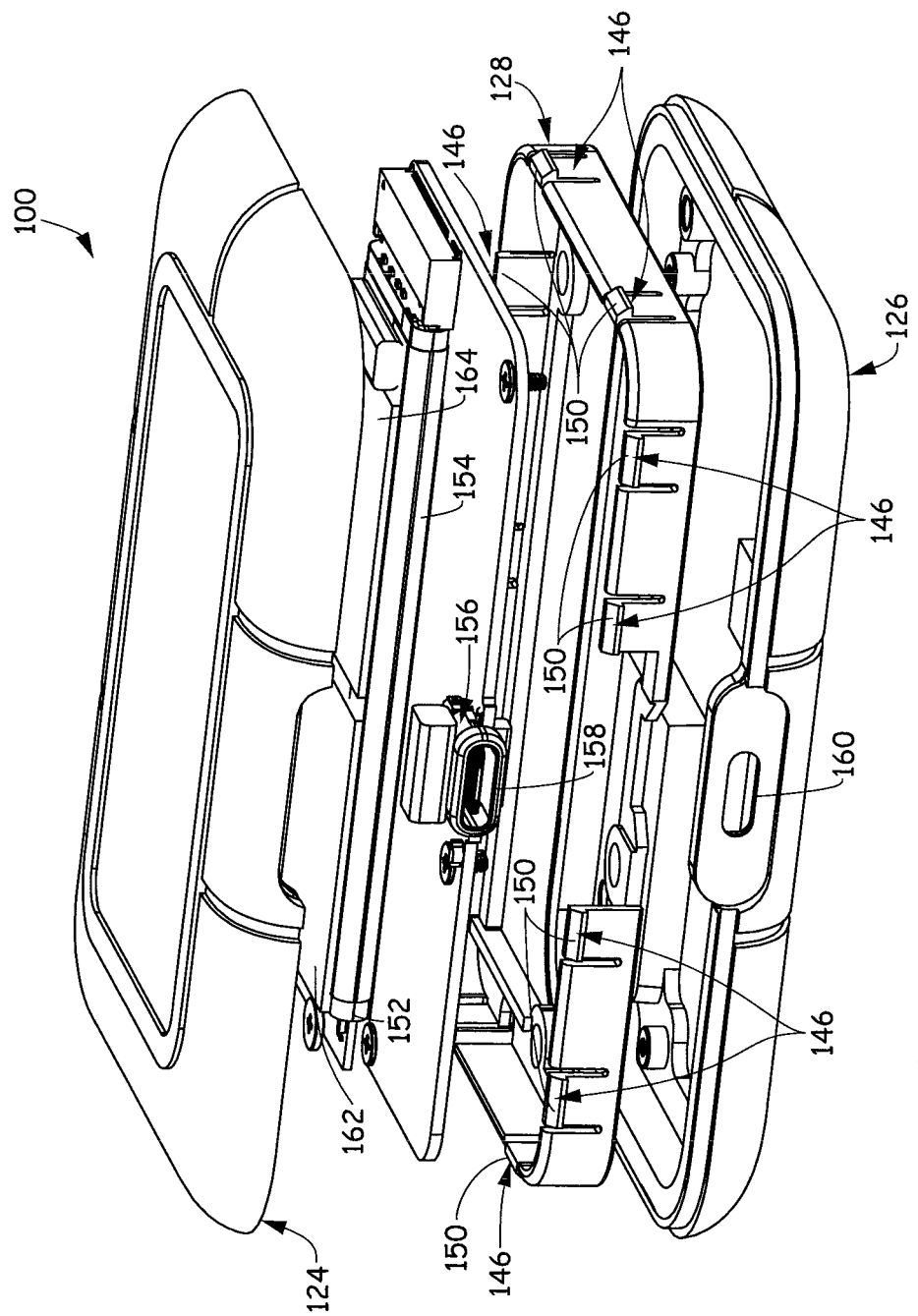
FIG. 3 is a perspective exploded view of FIG. 2.

FIG. 2 illustrates a perspective view of a portable data storage device 100 according to an embodiment. Portable data storage device 100 includes all of the components of portable data storage device 10 and additional features that implement the components of portable data storage device 10. FIG. 3 is a perspective exploded view of portable data storage device 100 of FIG. 2. Portable data storage device 100 includes a top case 124, a bottom case 126, a frame member 128 and a printed circuit board assembly (PCBA) 130. PCBA 130 includes SSD flash memory and other computer components and circuitry that generate internal heat. Portable data storage device 100 provides high speed data transfer, ruggedness and extreme durability. In particular, portable data storage device 100 has an IP67 or IP68 rating for extreme dust and water resistance and a 3 meter drop and two-ton car crush resistance all together in a palm-sized product. For example, the dimensions of portable data storage device 100 are approximately 97.9 mm (0.3.854 in.) in length, 64.9 (2.555 in.) mm in width and 17 mm (0.669 in.) in height and weighs 0.1 kg or 0.22 lb.

Figure 4:
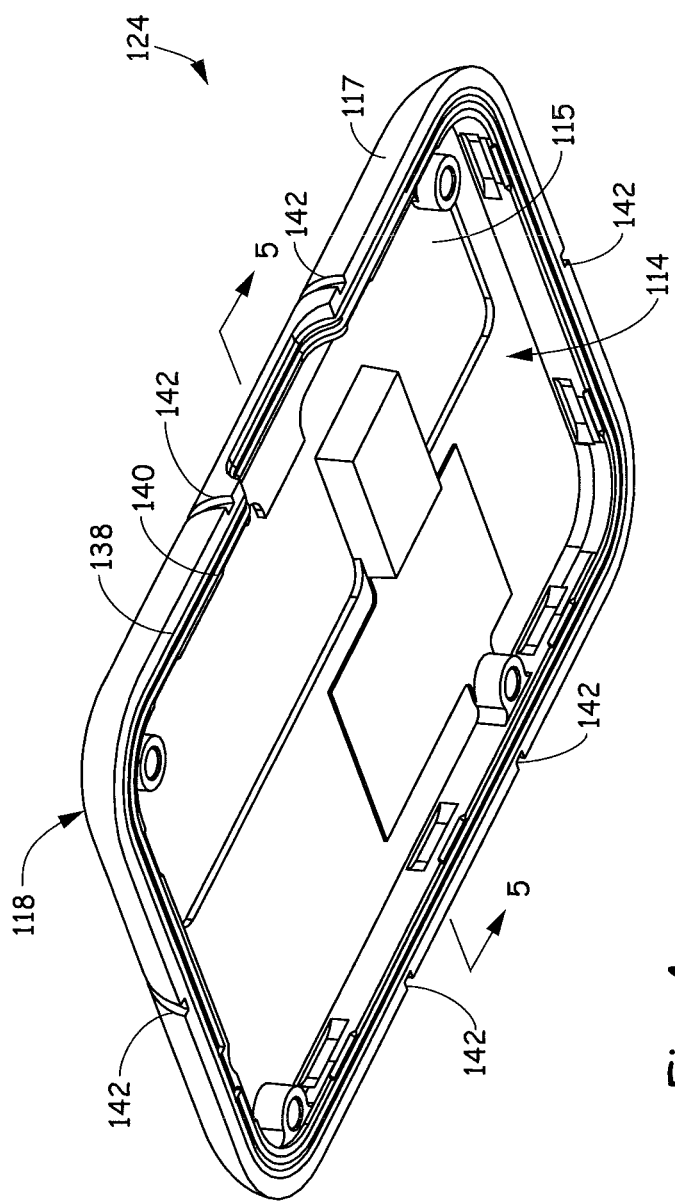
FIG. 4 is a perspective view of an interior of a top case of the portable data storage device illustrated in FIGS. 2 and 3.
Figure 5:
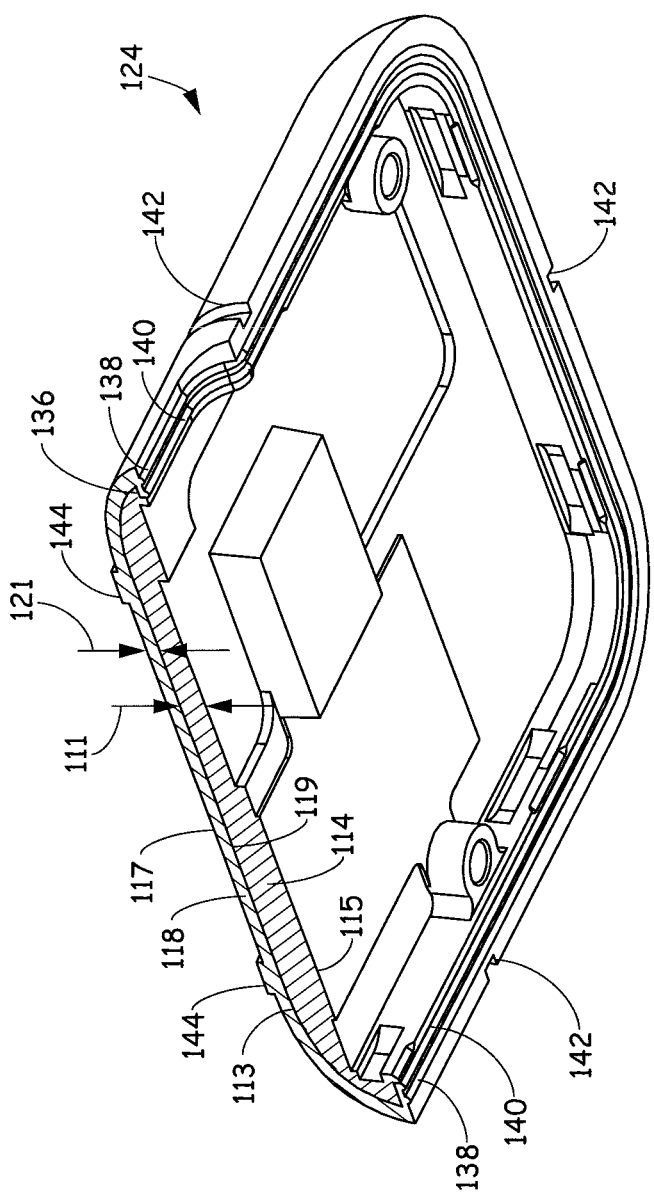
FIG. 5 is a perspective section view of the top case taken through the section line indicated in FIG. 4.

FIG. 4 is a perspective view of an interior of top case 124 of portable data storage device 100. FIG. 5 is a perspective section view of top case 124 taken through the section line indicated in FIG. 4. As illustrated in FIG. 5, top case 124 includes an interior layer 114 made of a first material and a coating layer 118 made of a second material that are bonded together. Interior layer 114 corresponds with enclosure wall 14 of FIG. 1 and coating layer 118 corresponds with exterior layer 18 of FIG. 1. During manufacture, top case 124 may be formed by die casting. For example, metal, such as Aluminum, is cast into a mold cavity to form interior layer 114. Then the material of coating layer 118, such as LSR, is shot into the mold to bond with the metal material of interior layer 114. Such a "double-shot" process forms top case 124 having coating layer 118 and interior layer 114.

In FIGS. 4 and 5, coating layer 118 has a thickness 121. In one embodiment, thickness 121 may be approximately 1 mm. However, thickness 121 may be greater than or less than 1 mm. For example, thickness 121 may be as low as approximately 0.5 mm. Interior layer 114 also has a thickness 111. In one embodiment, thickness 111 may be approximately 2 mm. However, while thickness 111 may be greater than or less than 2 mm, thickness 111 of interior layer 114 is greater than thickness 121 of coating layer 118. In particular, thickness 111 of interior layer 114 may vary and may be thicker than 2 mm in some areas. For example, thicker areas of interior layer 114 includes areas that need to be brought closer to internal heat sources in portable data storage device 100.

The thermal conductivity of a material measures the ability or capacity of a material to conduct heat. The thermal conductivity (k) of a material is as follows:

$$k = (QL)/(A\Delta T)$$

where Q is the amount of heat transfer through the material, L is the thickness of the material, A is the surface area of the material and $\Delta T$ is the difference in temperature. Different materials have different abilities to conduct heat and therefore have different thermal conductivities. In general, pure metals, such as copper (~385 W/m-° K) and aluminum (~205 W/m-° K), have higher thermal conductivities then alloy metals, such as steel (~50.2 W/m-° K) and brass (109 W/m-° K). However, all metals have a much higher thermal conductivity than glass (~0.8 W/m-° K), polyurethane (~0.02 W/m-° K), rubber (~0.2 W/m-° K), water (~0.6 W/m-° K) and air (~0.024 W/m-° K). This means the second material of coating layer 118, which may be made of LSR, has a thermal conductivity that is less than the thermal conductivity of the first material of interior layer 114, which may be made of a metal, such as aluminum. The differences in thermal conductivity of the first and second materials also means that the amount of heat energy that transfers from the first material to a user's hand (heat sink energy), is high at a relatively low temperature value, while the second material that has a low heat energy transfer and is poorly thermally conductive, such as LSR, must reach a higher temperature value before achieving an equivalent level of heat sink energy transfer.

In addition, based on the above equation, a change in thickness 121 of coating layer 118 will increase or decrease the exterior or interior temperature of portable data storage device 100. With thickness 121 of coating layer 118 being at 0.5 mm, the exterior or touch temperature will be greater than the exterior or touch temperature when thickness 121 is at 1 mm. Likewise, with thickness 121 of coating layer 118 being at 0.5 mm, the interior temperature will be less than the interior temperature when thickness 121 is at 1 mm.

As illustrated in FIG. 5, interior layer 114 includes an outer boundary 113, an inner boundary 115 and a rim 136 that connects outer boundary 113 to inner boundary 115. In one embodiment and as illustrated in FIGS. 4 and 5, outer boundary 113 is convex. As also illustrated in FIGS. 4 and 5, coating layer 118 includes outer surface 117 and inner boundary 119. Coating layer 118 covers outer boundary 113 of interior layer 114 and a portion of rim 136 including inner boundary 119 of coating layer 118 interfacing with outer boundary 113 of interior layer 114. Inner boundary 115 of interior layer 114 is free of coating layer 118, and the material of coating layer 118 that covers a portion of rim 136 includes a pair of ribs 138 and 140. Ribs 138 and 140 extend around the entirety of rim 136 and are configured to engage with bottom case 126, which will be described below. As illustrated in FIGS. 4 and 5, the features on the exterior of top case including recesses 142 and protrusions 144 are formed of coating layer 118 and are not part of interior layer 114.

Figure 6:
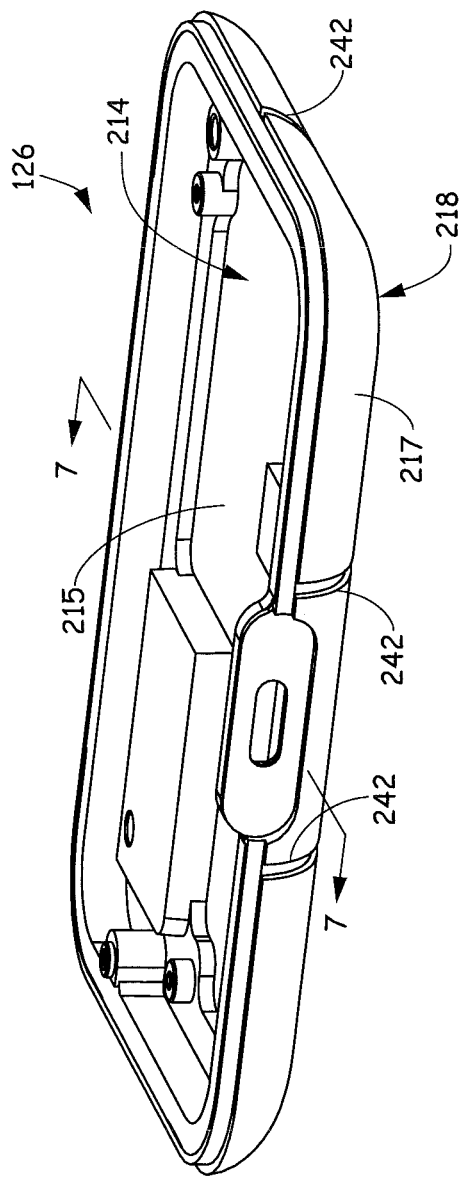
FIG. 6 is a perspective view of an interior of a bottom case of the portable data storage device illustrated in FIGS. 2 and 3.
Figure 7:
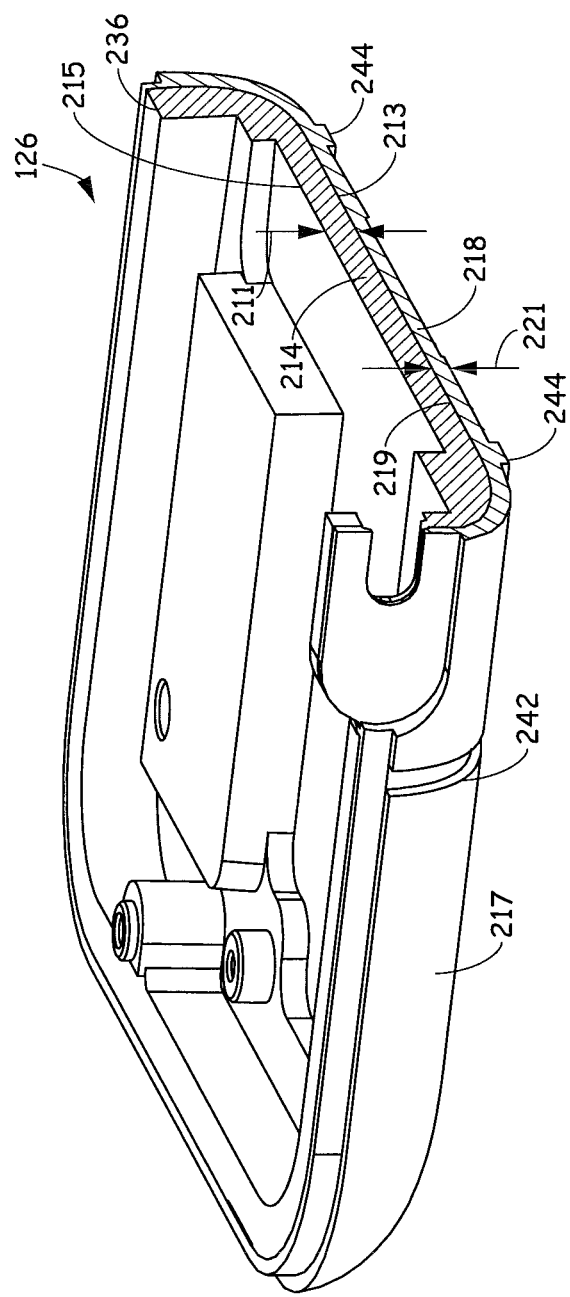
FIG. 7 is a perspective section view of the bottom case taken through the section line indicated in FIG. 6.

FIG. 6 is a perspective view of an interior of bottom case 126 of the portable data storage device 100 illustrated in FIGS. 2 and 3. FIG. 7 is a perspective section view of bottom case 126 taken through the section line indicated in FIG. 6. As illustrated in FIG. 7, bottom case 126 includes an interior layer 214 made of a first material and a coating layer 218 made of a second material that are bonded together. Interior layer 214 corresponds with enclosure wall 14 of FIG. 1 and coating layer 218 corresponds with exterior layer 18 of FIG. 1. During manufacture, bottom case 126 may be formed by die casting. For example, first material is made of metal, such as Aluminum, and is cast into a mold cavity to form interior layer 214. The second material of coating layer 218, such as LSR, is shot into the mold to bond with the metallic first material of interior layer 214. Such a process forms bottom case 126 having coating layer 218 and interior layer 214.

As illustrated in FIG. 7, interior layer 214 includes an outer boundary 213, an inner boundary 215 and a rim 236 that connects outer boundary 213 to inner boundary 215. In one embodiment and as illustrated in FIGS. 6 and 7, outer boundary 213 of interior layer 214 is convex. As also illustrated in FIGS. 6 and 7, coating layer 218 includes outer surface 217 and inner boundary 219. Coating layer 218 covers an entirety of outer boundary 213 of interior layer 214. Inner boundary 215 and rim 236 of interior layer 214 are free of coating layer 218. Ribs 138 and 140 of top case 124 and made of the material of coating layer 118 of top case 124 engage with rim 236 of bottom case 126. Upon assembly, ribs 138 and 140 act as a seal between top case 124 and bottom case 126. As illustrated in FIG. 7, the features on the exterior of bottom case 126, including recesses 242 and protrusions 244, are formed of coating layer 218 and are not part of interior layer 214.

In FIGS. 6 and 7, coating layer 218 has a thickness 221. In one embodiment, thickness 221 is approximately 1 mm. However, thickness 221 may be greater than or less than 1 mm. For example, thickness 221 may be as low as approximately 0.5 mm. Interior layer 214 also has a thickness 211. In one embodiment, thickness 211 may be approximately 2 mm. However, while thickness 211 may be greater than or less than 2 mm, thickness 211 of interior layer 214 is greater than thickness 221 of coating layer 218. In particular, thickness 211 of interior layer 214 may vary and may be thicker than 2 mm in some areas. For example, thicker areas of interior layer 214 includes areas that need to be brought closer to heat sources in portable data storage device 100.

As described above, a change in thickness 221 will increase or decrease the exterior or interior temperature of portable data storage device 100. With thickness 221 being at 0.5 mm, the exterior or touch temperature will be greater than the exterior or touch temperature when thickness 221 is at 1 mm. Likewise, with thickness 221 being at 0.5 mm, the interior temperature will be less than the interior temperature when thickness 221 is at 1 mm.

Figure 8:
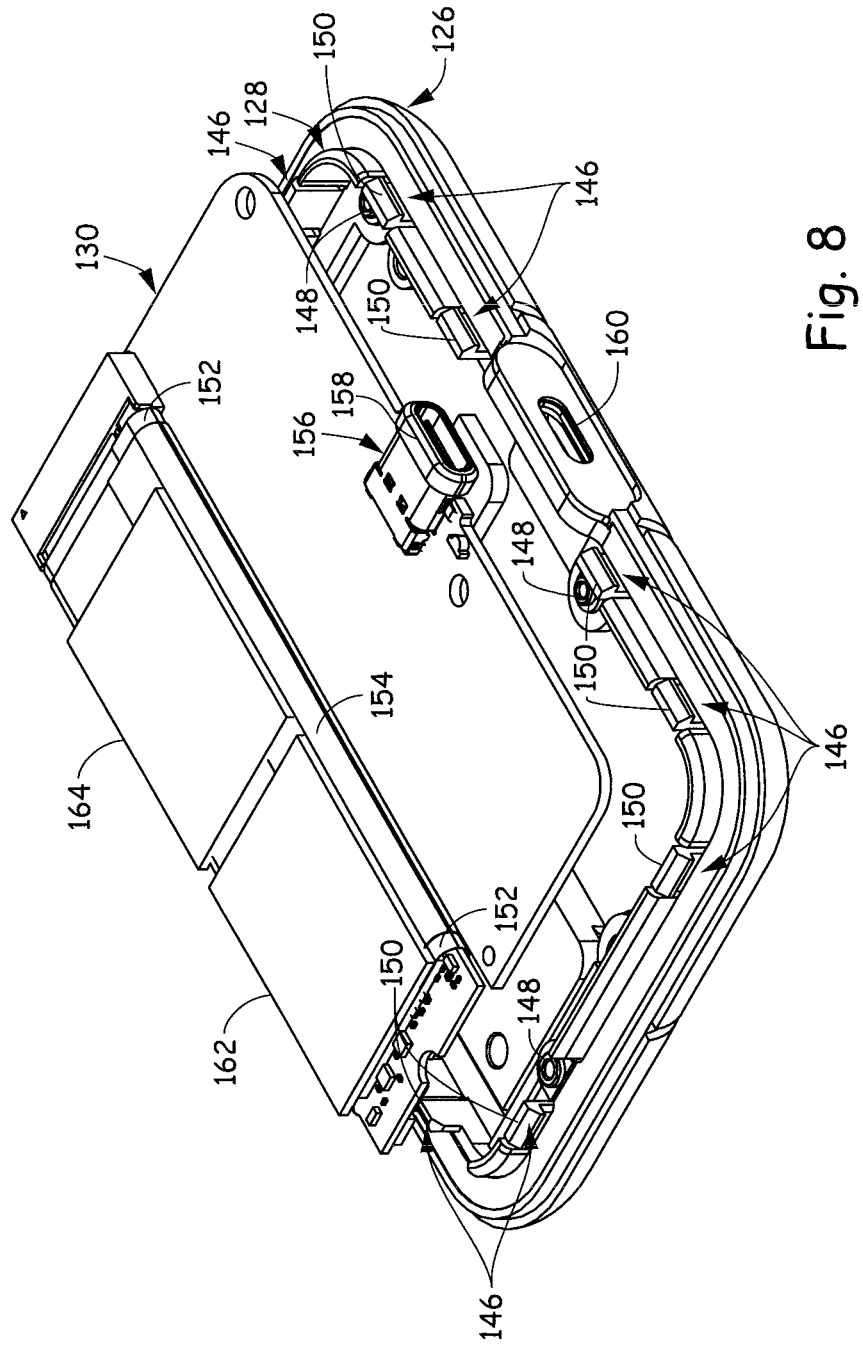
FIG. 8 is a perspective view of a printed circuit board assembly (PCBA) exploded from an assembled frame member and the bottom case of the portable data storage device illustrated in FIGS. 2 and 3.

FIG. 8 is a perspective view of PCBA 130 exploded from an assembled frame member 128 and bottom case 126 of the portable data storage device 100. With reference to FIG. 3 and FIG. 8, frame member 128 is mounted to bottom case 126 using adhesive and/or a plurality of fasteners 148. Frame member 128 as mounted to bottom case 126 is used to assemble or connect top case 124 with bottom case 126. Frame member 128 may be formed of, for example, and in its entirety, of plastic, and includes a plurality of integrally formed snap features 146. As illustrated, each snap feature 146 is spaced a distance from each other and provides cantilever snap-fitting of the bottom case 126 to the top case 124. In particular, each snap feature 146 includes a lever arm 150 configured to snap fit to top case 124. This will be shown and discussed in more detail below.

It should be realized that FIGS. 3 and 8 are simplified figures and PCBA 130 includes more components than the number of components illustrated. In FIGS. 3 and 8, such components have been removed to simplify the view. Regardless, PCBA 130 includes SSD flash, which is hidden from view by Mylar and foil wraps 152 and 154 and a USB connector 156. USB connector 156 has a rating of IP67 or IP68, which means that USB connector 156 is resistant to harmful dust and dirt when exposed to such conditions for up to 8 hours and either may be submerged in up to one meter of fresh water for 30 minutes or up to ⅕ meters of fresh water for 30 minutes. USB connector 156 further includes an O-ring 158 located around the periphery of connector 156. O-ring interferes with and seals input/output (IO) hole 160.

Figure 9:
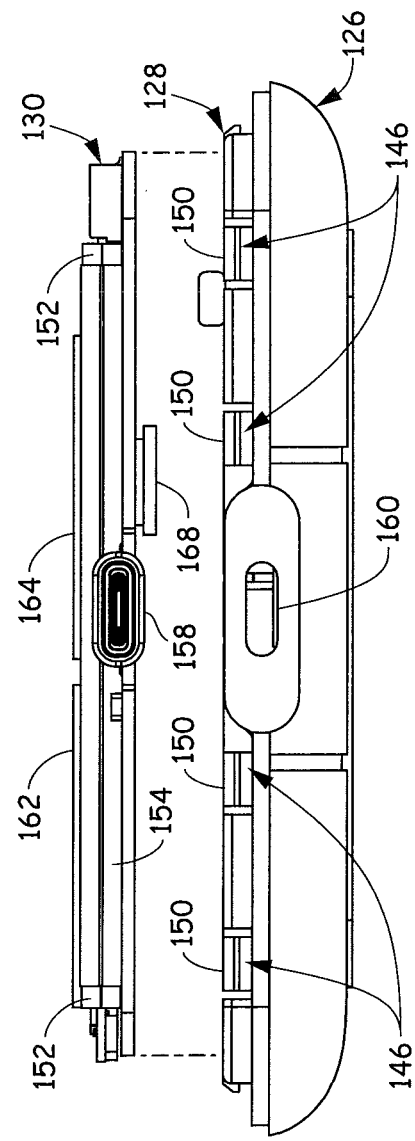
FIG. 9 is a front view of FIG. 8.
Figure 10:
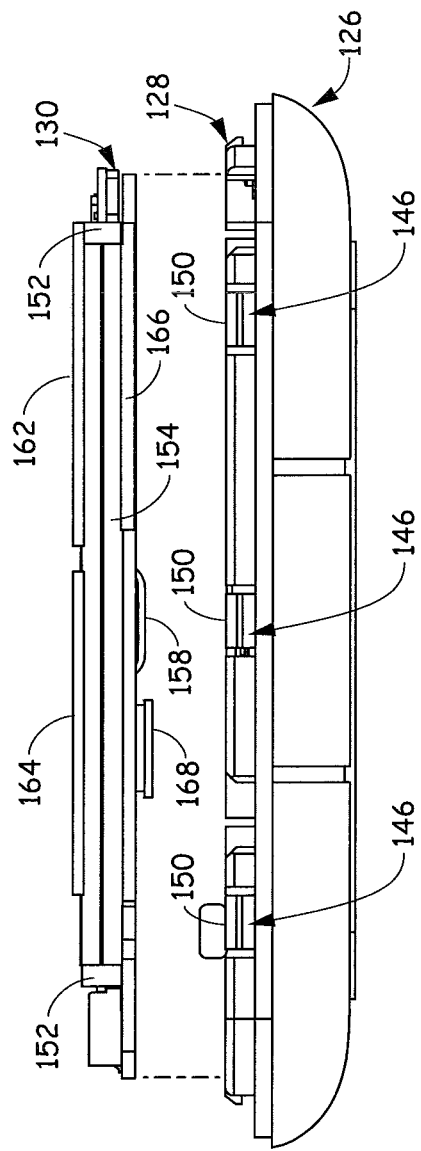
FIG. 10 is a back view of FIG. 8.

FIG. 9 is a front view of FIG. 8 and FIG. 10 is a back view of FIG. 8. As illustrated in FIGS. 3 and 8-10, portable data storage device 100 further includes a plurality of thermal pads made of a thermal interface material (TIM). As TIM 16 is described above in FIG. 1, the plurality of thermal pads are made of a high conductive material that is configured to efficiently couple and transfer heat energy from internal heat sources of PCBA 130 into enclosure wall or interior layer 114 of top case 124 and interior layer 214 of bottom case 126. In particular, portable data storage device 100 includes first and second and third thermal pads 162, 164 and 166 (FIG. 10). First and second thermal pads 162 and 164 transfer heat energy from SSD flash memory to interior layer 114 of top case 124. Third thermal pad 166 transfers heat energy from SSD flash memory to interior layer 214 of bottom case 126. Portable data storage device 100 further includes a fourth thermal pad 168 (FIGS. 9 and 10). Fourth thermal pad 168 transfer heat energy from an integrated circuit (IC) to interior metal layer 214 of bottom case 126. Interior layers 114 and 214 then work together to spread heat energy through the enclosure wall or layers 114 and 214.

Figure 11:
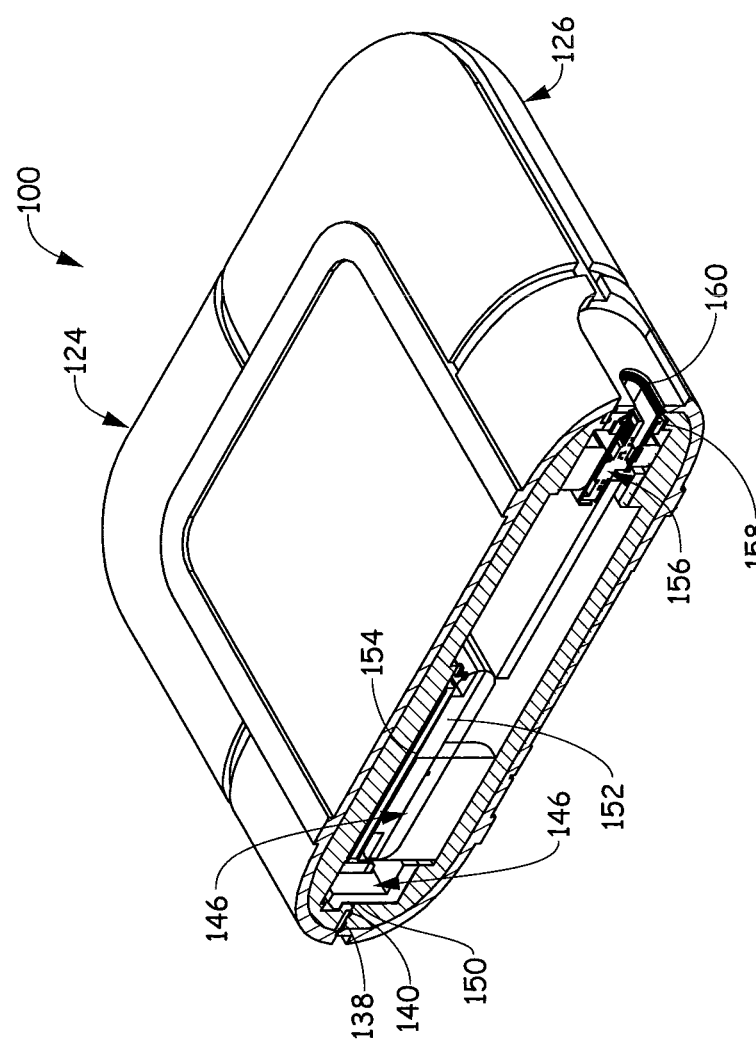
FIG. 11 is a perspective section view of the portable data storage device taken through the section line indicated in FIG. 2.

FIG. 11 is a perspective section view of portable data storage device 100 taken through the section line indicated in FIG. 2. FIG. 11 illustrates snap feature 146 and its lever arm 150 snap-fitted to top case 124. In particular, snap feature 146 is snap-fitted to interior layer 114 of top case 124. With snap features 146 all engaged with top case 124, ribs 138 and 140 seal bottom case 126 to top case 124. FIG. 11 also illustrates portions of SSD flash memory 170 as located inside Mylar and foil wraps 152 and 154. USB connector 156 is also illustrated in section including O-ring 158.

Portable data storage device 100 is provided with top case 124 having interior layer 114 made of a first material and including an outer boundary 113, an inner boundary 115 and a rim 136 that connects outer boundary 113 to inner boundary 115 and a coating layer 118 made of a second material. Coating layer 118 covers outer boundary 113 of interior layer 114 of top case 124. Portable data storage device 100 is also provided with a bottom case 126 having an interior layer 214 made of the same first material as the first material of interior layer 114 and including an outer boundary 213, an inner boundary 215 and a rim 236 that connects outer boundary 213 to inner boundary 215 of bottom case 126 and a coating layer 218 made of the same second material as the second material of coating layer 118. Coating layer 218 covers outer boundary 213 of interior layer 214 of bottom case 126. Portable data storage device 100 is assembled by snap-fitting top case 124 to bottom case 126 and sealing top case 124 to bottom case 126 with coating layer 118 of top case 124. Coating layer 118 of top case 124 is further configured to cover at least a portion of rim 136 of top case 124 and further configured to provide at least one protruding rib 138 and 140 that is formed from the portion of the coating layer 118 of top case 124 that covers the portion of rim 136 of top case 124. When sealing top case 124 to bottom case 126, rim 236 of interior layer 214 of bottom case 126 is engaged with the at least one protruding rib 138 and 140.

The above-disclosed subject matter is to be considered illustrative, and not restrictive, and the appended claims are intended to cover all such modifications, enhancements, and other embodiments, which fall within the true scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A portable data storage device comprising:
   at least one internal heat source;
   a top case comprising:
      an interior layer made of a first material and including an outer boundary, an inner boundary and a rim that connects the outer boundary to the inner boundary;
      a coating layer made of a second material, wherein a portion of the coating layer covers the outer boundary of the interior layer of the top case and the rim of the interior layer of the top case;
      wherein the portion of the coating layer of the top case that covers the rim includes at least one protruding rib that extends about a periphery of the top case;
   a bottom case comprising:
      an interior layer made of the first material and including an outer boundary, an inner boundary and a rim that connects the outer boundary of the bottom case to the inner boundary of the bottom case;
      a coating layer made of the second material, wherein the coating layer covers the outer boundary of the interior layer of the bottom case;
   wherein the second material has a thermal conductivity that is less than a thermal conductivity of the first material and wherein the heat energy from the internal heat sources is transferred to an ambient environment at outer surfaces of the coating layers of the bottom case and the top case; and
   wherein the at least one protruding rib that extends about the periphery of the top case directly engages with the rim of the interior layer of the bottom case to provide a water-tight seal between the top case and the bottom case.

2. The portable data storage device of claim 1, wherein the first material comprises metal.

3. The portable data storage device of claim 2, wherein the first material comprises aluminum or an aluminum alloy.

4. The portable data storage device of claim 1, wherein the second material comprises rubber.

5. The portable data storage device of claim 4, wherein the second material comprises liquid silicone rubber (LSR).

6. The portable data storage device of claim 1, wherein outer boundary of the interior layer of the top case and the outer boundary of the interior layer of the bottom case are convex.

7. The portable data storage device of claim 1, wherein the interior layers of the top case and the bottom case comprise thicknesses and the coating layers of the top case and the bottom case comprise thicknesses, wherein the thicknesses of the coating layers are less than the thicknesses of the interior layers.

8. A method of assembling a portable storage device, the method comprising:
   providing a top case comprising:
      an interior layer made of a first material and including an outer boundary, an inner boundary and a peripheral rim that connects the outer boundary to the inner boundary;
      a coating layer made of a second material, wherein the coating layer covers the outer boundary and the peripheral rim of the interior layer of the top case and therefore a periphery of the top case;
   providing a bottom case comprising:

an interior layer made of the first material and including an outer boundary, an inner boundary and a rim that connects the outer boundary of the bottom case to the inner boundary of the bottom case;

a coating layer made of the second material, wherein the coating layer covers the outer boundary of the interior layer of the bottom case;

snap-fitting the top case to the bottom case; and sealing the top case to the bottom case with the coating layer of the top case, wherein the coating layer of the top case extends around an entirety of the periphery of the top case and directly engages with the peripheral rim of the interior layer of the bottom case to form at least a water resistant seal between the top case and the bottom case.

9. The method of claim 8, wherein providing the top case further comprises providing at least one protruding rib that is formed from the portion of the coating layer of the top case that covers the portion of the rim of the interior layer of the top case and extends about the periphery of the top case.

10. The method of claim 9, wherein sealing the top case to the bottom case comprises engaging the peripheral rim of the interior layer of the bottom case with the at least one protruding rib of the coating layer.

11. A portable storage device comprising:

a top case including an interior layer made of a first material and including an outer boundary, an inner boundary and a peripheral rim that connects the outer boundary to the inner boundary and a coating layer made of a second material, wherein the coating layer of the top case covers the outer boundary and the peripheral rim of the interior layer of the top case;

a bottom case including an interior layer made of the first material and including an outer boundary, an inner boundary and a peripheral rim that connects the outer boundary of the bottom case to the inner boundary of the bottom case and a coating layer made of the second material, wherein the coating layer of the bottom case covers the outer boundary of the interior layer of the bottom case; and a plurality of snap features that snap-fit the top case to the bottom case;

wherein the coating layer of the top case seals the bottom case to the top case using the force applied by the plurality of snap features, wherein the coating layer of the top case extends around an entirety of a periphery of the top case and directly engages with the peripheral rim of the interior layer of the bottom case to form at least a water resistant seal between the top case and the bottom case.

12. The portable data storage device of claim 11, wherein the first material comprises metal.

13. The portable data storage device of claim 12, wherein the first material comprises aluminum or an aluminum alloy.

14. The portable data storage device of claim 11, wherein the second material comprises rubber.

15. The portable data storage device of claim 14, wherein the second material comprises liquid silicone rubber (LSR).

16. The portable data storage device of claim 11, wherein the interior layers of the top case and the bottom case each comprise a first thickness and the coating layers of the top case and the bottom case each comprise a second thickness, wherein the second thickness of the coating layers is less than the first thickness of the interior layers.

* * * * *